United States Patent [19]
Griner

[11] 4,224,568
[45] Sep. 23, 1980

[54] FREQUENCY TO DIGITAL CONVERTER

[75] Inventor: Paul Griner, Maryland Heights, Mo.

[73] Assignee: Wagner Electric Corporation, St. Louis, Mo.

[21] Appl. No.: 903,860

[22] Filed: May 8, 1978

[51] Int. Cl.² ................ G01R 23/10; B60T 8/02
[52] U.S. Cl. ................ 324/78 D; 303/95; 303/97; 307/233 B; 328/130; 364/484
[58] Field of Search .......... 235/92 FQ, 92 TF; 303/91, 95, 97, 109; 307/233 R, 233 B, 271, 295; 324/78 R, 78 D, 160, 166; 328/130, 132, 136, 140; 340/53, 62, 263, 669, 670; 364/484, 486, 565

[56] References Cited
U.S. PATENT DOCUMENTS

| | | | |
|---|---|---|---|
| 2,992,384 | 7/1961 | Malbrain | 324/78 D |
| 3,524,131 | 8/1970 | McWaid | 324/78 D |
| 3,713,026 | 1/1973 | Kubo | 328/130 X |
| 3,829,785 | 8/1974 | Schroder et al. | 324/78 D X |
| 3,922,670 | 11/1975 | Shaw et al. | 235/92 FQ X |
| 4,107,600 | 8/1978 | McMannis | 364/484 X |

Primary Examiner—Trygve M. Blix
Assistant Examiner—Reinhard J. Eisenzopf
Attorney, Agent, or Firm—Eyre, Mann, Lucas & Just

[57] ABSTRACT

A frequency measuring device measures the number of full cycles of a periodically time varying signal which occurs in a fixed sampling period and calculates the fraction of a cycle of the signal occurring in the sampling period.

18 Claims, 4 Drawing Figures

FREQUENCY TO DIGITAL CONVERTER

BACKGROUND OF THE INVENTION

The present invention relates to frequency measurement devices of the type which measure the number of cycles of the signal to be measured within a fixed sampling period.

In the measurement of high frequency alternating signals, such as rf, satisfactory accuracy can usually be attained by counting the positive-going or negative-going zero crossings of the alternating signal over a fixed sampling period. For example, a 27 megahertz signal can be very accurately measured by counting the number of positive-going or negative-going zero crossings of the signal occurring in one second. This is the principle employed in commercially available frequency measurement equipment manufactured and sold by numerous instrument makers.

In the conventional frequency measurement equipment, the beginning and end of the sampling period occur at arbitrary points in the phase of the signal being measured. If the beginning of the sampling period just misses a zero crossing, the equipment counts almost a full cycle less than the actual number of cycles in the sampling period. Similarly, if the end of the sampling period occurs just before a zero crossing, the equipment again counts almost a full cycle less than the actual number of cycles in the sampling period. It is, therefore, possible for conventional frequency measurement equipment to count almost two complete cycles less than the actual number of cycles during the measurement period. However, when measuring signals of high frequency such as 27 kilohertz during long periods of time such as one second, the loss of two cycles from 27,000 cycles results in an insignificant error in the measured quantity.

The same is not true when relatively infrequent signals are to be measured over a sampling period that is on the same order of magnitude as the period of the frequency to be measured. For example, frequency measurement devices associated with vehicle wheel speed sensors have a limited capability to generate a rapidly varying periodic signal. For example, a truck wheel speed sensor for 20-inch truck wheels generating 60 pulses per rotation of the wheel produces a frequency of only about 12 hertz per mile per hour of wheel speed. Consequently, a speed of 5 miles per hour produces a frequency of only about 60 hertz. An error of nearly two cycles in a sampling period of 0.04 seconds, for example, yields a measurement error of 33%. As a further complication, it requires only a slightly higher frequency within the sampling period to permit the zero crossings at the beginning and end of the sampling period to be counted. This can cause an almost instantaneous change in apparent speed of about 33%. Since wheel speed measurement devices are typically used as input sensors for wheel slip control systems which interpret velocity changes as indications of wheel skidding and generate brake-release signals in response thereto, such virtually instantaneous changes in measured wheel speed are unacceptable.

In order to improve their accuracy, counter types of frequency measurement equipment must count input cycles for a longer period. To achieve an accuracy improvement of a factor of eight, for example, the sample period must be increased in length by a factor of eight. This requirement conflicts with the desire in, for example, wheel slip control systems, to obtain frequent measurements of wheel speed in order to permit rapid response to changing wheel slip conditions. Practical wheel slip control systems require at least several measurements of wheel speed per second and preferably from about 10 to about 30 measurements of wheel speed per second. With the frequency numbers previously described, it is clear that the partial cycles of input signal cannot safely be ignored but must somehow be accounted for.

The prior art discloses many varieties of phase-locked loop systems, typically employing digital circuits, for generating a signal proportional to the frequency of the relatively slowly occurring input signals. In U.S. Pat. Nos. 4,040,677; 4,047,766; 4,033,633 and 3,838,889, a comparison of an internally controlled frequency pulse generator with the frequency of the incoming signal generates an error signal which causes a number stored in a register to increase or decrease depending upon the sign of the error. The stored number is used to alter the frequency of the controlled frequency pulse generator to attempt to maintain its frequency in step with the sensor input frequency. The correction number stored in the register provides a measure of the frequency of the incoming signal and is passed on to using circuits, typically wheel slip control circuits.

In U.S. Pat. No. 4,056,287, the phase-locked loop idea is employed in which a count-up counter counts up at a frequency varying as the positive exponential with exponent greater than one and a second counter which is triggered on by a predetermined count in the first counter counts down in a second exponential ratio with an exponent inversely proportional to the exponent in the first counter. The use of exponential or logarithmic counting sequences is proposed as a method of rapidly attaining a measurement of the input frequency.

All of the digital phase locked loop devices require a large number of digital circuits to perform all of the complex functions involved. Such complexity adds to the manufacturing and maintenance cost of the devices.

SUMMARY OF THE INVENTION

The applicant has now invented an apparatus which is relatively simple and inexpensive to manufacture but which overcomes the problem of inaccuracy of frequency measurement of slowly occuring signals without the necessity of using a phase locked loop.

The present invention counts the number of zero crossings of the input signal occurring during a fixed sample period. The length of the last full cycle in the sampling period is calculated and the relationship between the length of the period remaining from the last zero crossing to the end of the period is compared with the calculated full-cycle length. This relationship gives the fraction of a full period left over at the end of the sampling period after the last counted zero crossing.

The fractional period between the beginning of the sampling period and the occurrence of the first zero crossing is calculated from the tail-end residue of the previous period. This calculation is performed by subtracting the fractional period measured at the end of the preceding cycle from one. This, therefore, yields an estimate of the fractional period unaccounted at the beginning of the present cycle. The sum of the full signals counted plus the fractional signal at the beginning of the sampling period and the fractional signal at the end of the sampling period gives a very good approximation of the actual frequency being measured.

In measuring the fractional period occurring between the last zero crossing and the end of the sampling period, slightly improved accuracy may be attainable by waiting until the end of the input cycle before calculating the fractional cycle at the end of the period. This technique would require that a delay of variable length be imposed at the end of each sampling period until the calculation was performed. Such a variable delay is unacceptable in many applications such as, for example, wheel slip control systems. In the preferred embodiment of the invention, this difficulty is avoided by using the last full period of the input signal prior to the end of the sample period as an estimate of the length of the period which occurs after the last zero crossing and ending after the end of the sampling period. Consequently, a relatively short uniform-length delay for calculation is imposed at the end of each sampling period rather than the variable length, and potentially a very long, delay which would otherwise be required in awaiting the end of a cycle following the last zero crossing. Any error which arises due to the use of the last full cycle of input as an estimator of the period of the cycle which ends after the end of the sample period is negligible.

DETAILED DESCRIPTION OF THE PREFERRED EMBODIMENT

Figure 1:
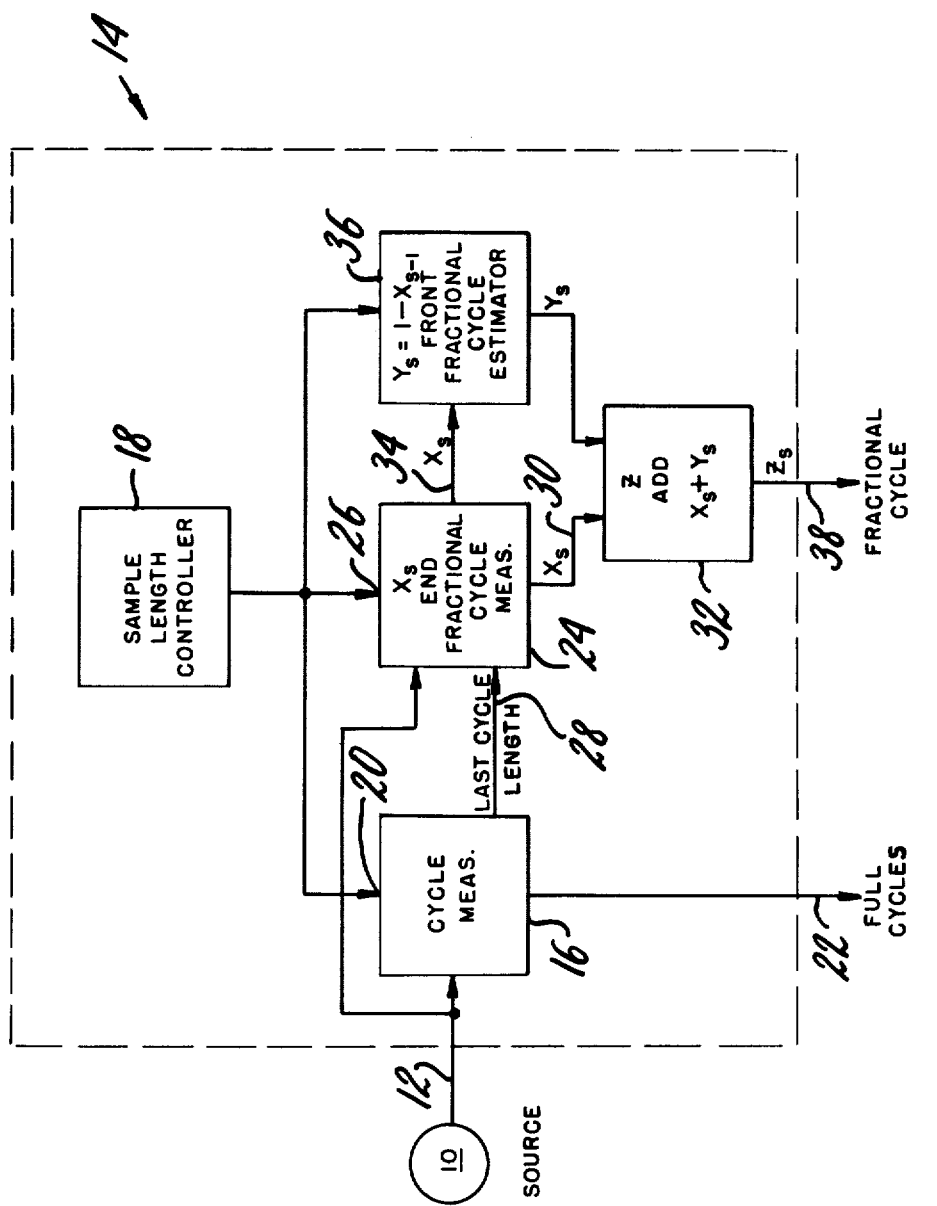
FIG. 1 shows a simplified block diagram of an embodiment of the present invention.

Referring now to FIG. 1, there is shown a simplified block diagram of a frequency sensor according to the present invention.

A source 10 of alternating current signal is connected by input line 12 to frequency measurement equipment 14 according to the present invention.

The frequency measurement equipment 14 may be implemented with analog circuits, digital circuits or a hybrid combination of digital and analog. In addition, the circuits may be built of discrete components or may be built of a mixture of discrete and integrated circuits. The following description of FIG. 1 is independent of whether the circuits are implemented in analog or digital fashion and whether discrete or integrated components are employed.

The input line 12 is connected to a cycle measurement device 16 which measures the number of times the signal from the source 10 passes through some condition. Depending on the types of circuits used in cycle measurement device 16, the positive peak, negative peak, positive-going zero crossing, negative-going zero crossing, or positive- or negative-going crossing of a positive or negative threshold may be employed as the point at which the cycle measurement device decides that a full cycle has occurred. In the preferred embodiment of the invention, the zero crossing of the signal, preferably in the negative-going direction is preferred for the recognition of the occurrence of an input signal due to the greater accuracy which flows from the usually steeper slope of many alternating current signals as they pass through zero. This tends to yield a smaller error in establishing an exactly repeatable point in the cycle of the input signal.

A sample length controller 18 has its output connected to a control input 20 of the cycle measurement device 16. The sample length controller 18 generates signals which enable cycle measurement device 16 to begin and end counting cycles of the signal on the input line 12. At the end of a sample, the measurement of full input cycles is connected from cycle measurement device 16 to full-cycle output line 22 to be made available to external devices, not shown.

The input signal on input line 12 is also connected to one input of fractional cycle measurement device 24. The output from sample length controller 18 is connected to control input 26 of fractional cycle measurement device 24.

Cycle measurement device 16 calculates the length of each full cycle and, at the end of each full cycle, this length is connected via line 28 to fractional cycle measurement device 24 where it is stored. Consequently, fractional cycle measurement device 24 is continuously in possession of the length of the immediately preceding full cycle. At the end of the sampling period, the length of the fractional cycle between the end of the last full period and the end of the sample period is divided by the length of the last full cycle stored in fractional cycle measurement device 24. This fraction, always less than or equal to 1, is connected via line 30 to adder 32. The same signal is also connected via line 34 to front fractional cycle estimator 36 where it is used to estimate the fractional cycle at the beginning of the next sampling period. The front fractional cycle in sample S is approximated by 1- the end fractional cycle at the end of the preceding cycle S-1. This value of the front fractional cycle is stored and is transmitted to adder 32 which adds the front fractional cycle to the end fractional cycle when it is calculated and outputs the fractional cycle sum on output line 38 for use by external circuits, not shown. The fractional cycle sum on output line 38 may have a magnitude almost equal to 2. When the external circuits, not shown, receive both the full cycles on full-cycle output line 22 and the fractional cycles on output line 38, the simple sum of the two provides a very accurate calculation of the frequency of input cycles from the source 10 during the sample length from the sample length controller 18.

Although the present invention may be fully implemented using analog processes, the preferred embodiment employs a digital method due to the simplicity and cheapness of digital circuitry. In addition, the cheapness of the digital circuitry is enhanceable by the use of integrated circuit devices with the most preferred embodiment being large scale integrated digital devices.

Figure 2:
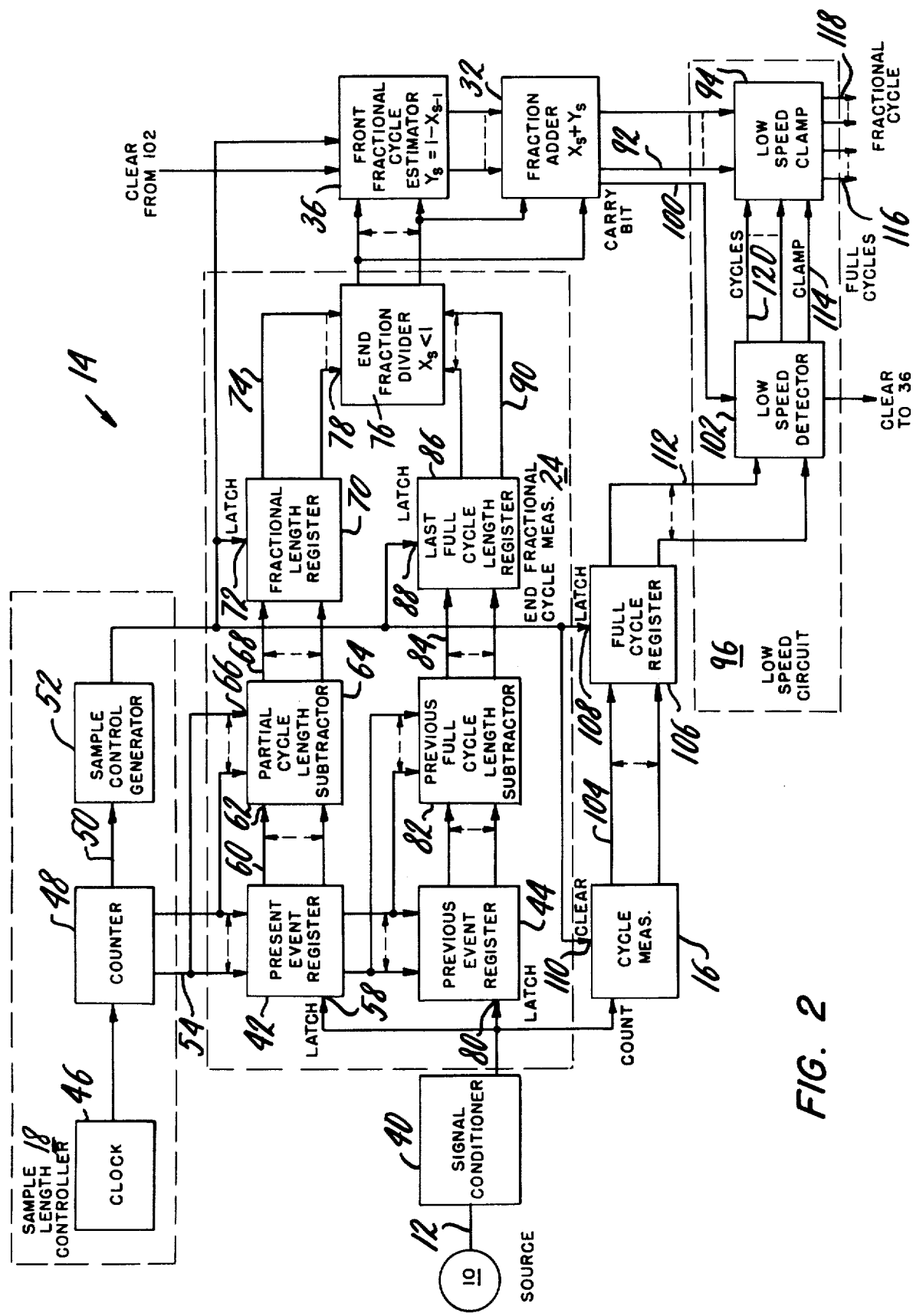
FIG. 2 shows a block diagram of a digital embodiment of the present invention.

Referring now to FIG. 2, there is shown a digital implementation for the frequency measurement equipment 14. As previously explained, the signal from the source 10 may have any cyclically varying wave-shape. In one special case of a wheel speed sensor, the signal from the source 10 is approximately a sine wave signal having varying amplitude and frequency. A signal conditioner 40 may optionally be interposed in the input line 12 to standardize the signal from the source for use by following circuits. For example, the signal conditioner 40 may generate a single narrow positive-going pulse each time the input signal completes a cycle. The completion of a cycle may be the positive-going or negative-going transition of the input pulses or it may be some other recognizable point on the input signal. For purposes of the present description, it is assumed that the signal conditioner 40 generates a single 5-volt output pulse of one microsecond length each time the input signal switches from its most positive condition to its mostnegative condition.

The pulses from signal conditioner 40 are connected in parallel to the latch inputs of present event register 42 and previous event register 44 as well as to the toggle input of cycle measurement counter 16.

In the sample length controller 18 a free-running clock 46 generates a continuous high-frequency string of clock pulses. The free-running clock 46 is preferably both accurate and stable, having accuracy and stability as good as that provided by a quartz-crystal-controlled clock. The frequency of the free-running clock 46 is preferably much higher than the highest expected frequency of the source 10. For example, with a source 10 having a maximum output frequency of 1 kilohertz, a clock frequency of 12.5 kilohertz may be employed.

The clock pulses from free-running clock 46 are connected to a counter 48. Counter 48 is preferably a serial input self-resetting counter having a capacity at least great enough to contain the full number of output pulses of the clock 46 during one sample period. For reasons which will be explained, in the preferred embodiment, the counter 48 has a capacity equal to twice the number of output pulses from the free-running clock 46 during a sample period. For example, a counter 48 having a capacity of 512 clock pulses would provide a sample period of 40.96 milliseconds from a 12.5 kilohertz clock frequency. However, a self-resetting counter 48 having 10 binary bits is used in one embodiment to yield a capacity of 1024. The counter 48 counts output pulses from the free-running clock 46 from zero to 1023 and then resets itself to zero.

One output of the counter 48 is connected on line 50 to a sample control generator 52. The sample control generator 52 generates one output when the counter 48 reaches a count of 512 and generates a second output when the counter 48 resets itself on the count of 1024. Consequently, the sample control generator 52 generates an evenly spaced string of pulses spaced apart by the desired sample width.

All bits in the counter 48 are connected in parallel over parallel lines 54 to inputs of present event register 42 and to partial cycle length subtractor 64. Each time a pulse signal arrives at latch input 58 of the present event register 42 from signal conditioner 40, the number existing at the instant in counter 48 is latched into present event register 42 and the previous contents of the register are erased. Consequently, the present event register 42 always contains the count which existed in counter 48 at the last occurrence of an output pulse from signal conditioner 40. This stored number is connected from present event register 42 on parallel lines 60 to one set of inputs 62 of partial length subtractor 64. The number at the second set of inputs 66 of partial cycle length subtractor 64 is, of course, the current state of continuously running counter 48. The difference between the number at input 66 and input 62 is the number of clock pulses since the last pulse input to present event register 42 from signal conditioner 40. This value is connected on parallel lines 68 to the input of fractional length register 70. The pulse from sample control generator 52 to latch input 72 erases any number previously stored in fractional length register 70 and stores therein the difference signal existing on lines 68 at the instant of the sample pulse. Consequently, the number then stored in the fractional length register 70 is a number related to the length of the fractional cycle between the last output of signal conditioner 40 and the end of sample period. This value is connected on parallel lines 74 to partial cycle inputs 78 of end fraction divider 76.

At the occurrence of each pulse output from signal conditioner 40 at latch input 80 of previous event register 44, the number then stored in present event register 42 is transferred into previous event register 44 and stored therein. This occurs at the same time that the number in counter 48 is being transferred into present event register 42. However, the timing of the signals is such that the number stored in previous event register 44 is the number previously stored in the present event register 42. Consequently, at any given time, the present event register 42 contains the number existing in counter 48 at the time of the last output from signal conditioner 40, whereas the number in the previous event register 44 is the count in counter 48 which existed two input pulses in the past. The values in the present event register 42 and previous event register 44 are subtracted from each other in previous full cycle length subtractor 82. These values are connected on parallel lines 84 to last full cycle length register 86 but are ignored until a sample pulse appears at the latch input 88. The signal at latch input 88 enables the storage of the number existing on parallel lines 84 at that instant. This value is the length of the last full cycle in the sample period. The length of the last full cycle is connected on parallel lines 90 to end fraction divider 76. End fraction divider 76 divides the fractional cycle length occurring after the last input pulse from signal conditioner 40 by the full cycle length of the last full cycle on lines 90. This yields a fraction which should be less than one. Under dynamically changing signal rates from source 10, it is possible that the end fraction may be calculated as slightly greater than one. In order to avoid errors, the end fraction is limited to a value of less than one.

The end fraction thus calculated is connected to fraction adder 32. The end fraction is also connected to front fraction cycle estimator 36 which calculates a front fraction estimate for the succeeding sample period. The front fraction estimator makes the estimate of the magnitude of the front fraction on the assumption that the fractional cycle for the first pulse from signal conditioner 40 in the present sampling period is equal to one minus the end fraction from the preceding period. As shown in the box for front fraction cycle estimator 36, the front fraction $Y_s$ for sample period S is:

$$Y_s = 1 - X_{s-1}$$

Where: Y is the front fraction estimate for the present sample and $X_{s-1}$ is the end fraction from previous sample.

The end fraction from the present cycle and the front fraction from the previous cycle, calculated from the stored value of the end fraction from the previous cycle, are connected to fraction adder 32.

Fraction adder 32 takes the sum of the end fraction from end fraction divider 76 and the front fraction from front fraction cycle estimator 36. The fractional part of the sum in fraction adder 32 is connected on parallel lines 92 to low speed clamp 94 in low speed circuit 96. When the frequency of source 10 is changing rapidly, it is possible for the output of fraction adder 32 to exceed one. In that case, a carry bit is connected on line 100 to low speed detector 102.

The output of the cycle measurement counter 16 is connected on parallel lines 104 to full cycle register 106 upon the occurrence of the sample pulse at latch input 108 of full cycle register 106, the count representing the number of full cycles in the sample period from cycle measurement counter 16 is stored in full cycle register 106 and any number previously stored is erased. At the same time, the sample pulse connected to the clear input 110 of cycle measurement counter 16 resets cycle measurement counter 16 and enables it to begin counting up from its reset condition. As will be explained, cycle measurement counter 16 may be preset to minus one during the clearing function in order to accommodate the fact that the number of pulses from signal conditioner 40 will always exceed by one the number of cycles of signal from source 10. Other means for compensating for this extra count will be later explained in connection with other parts of the preferred embodiment. The number of full cycles stored in full cycle register 106 is connected on parallel lines 112 to low speed detector 102. In the special case when either zero or one pulse is received from signal conditioner 40, the period of the signal from the source 10 is longer than the sample period from sample control generator 52. In this case, it is convenient to define the frequency of the source to be equal to the frequency of the output of the sample control generator. Consequently, low speed detector 102 generates a clamp signal which is connected via clamp line 114 to low speed clamp 94. A clamp signal on the clamp line 114 causes the full cycle output lines 116 to indicate one cycle and causes the fractional cycle output lines 118 to indicate zero.

When a single pulse from signal conditioner 40 is counted and stored in full cycle register 106 and when a carry bit is connected on line 100 to low speed detector 102, low speed detector 102 determines that a full cycle plus a fraction has occurred during the sample period, in this case the clamp signal is removed and the one cycle is connected via cycles input lines 120 to low speed clamp 94. Low speed clamp 94 thereupon permits the one cycle indication to occur on full cycle output lines 116 and the fractional cycle indication to occur on fractional cycle output line 118.

For sample periods during which two or more input pulses are generated by signal conditioner 40, low speed detector 102 connects the sum of the outputs from full cycle register 106 and the carry bit from fraction adder 32 to low speed clamp 94. Low speed clamp 94 connects the number of full and fractional cycles on lines 116 and 118 respectively to external circuits.

Figure 3:
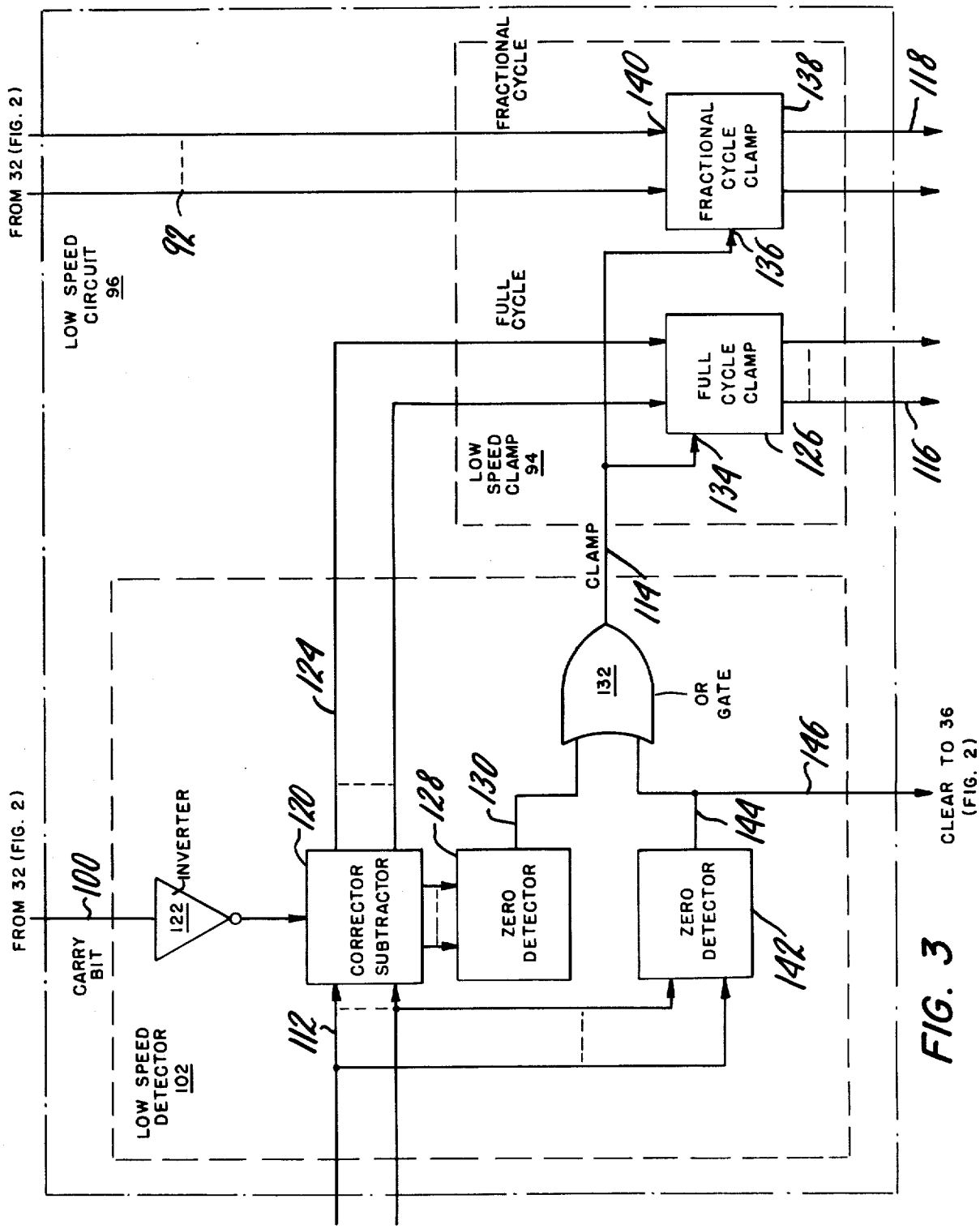
FIG. 3 shows a block diagram of a low speed circuit.

Turning now to FIG. 3, an embodiment of the low speed detector 102 is shown in which correction is made for the fact that full cycle register 106 accumulates one count more than the number of cycles of the source 10 signal. It is assumed that cycle measurement counter 16 is reset to zero at the end of each sample period.

The number of pulses from signal conditioner 40 counted during the immediately preceding sample period is connected on lines 112 to corrector subtractor 120. As previously noted, this count is one greater than the number of cycles of the signal from source 10. The carry bit from fraction adder 32 is connected on line 100 to inverter 122. The output of the inverter 122 is subtracted in corrector subtractor 120 from the number connected on lines 112. Since the carry bit is inverted in inverter 122, if the carry bit is one, the output of the inverter is zero and no subtraction takes place. Conversely, if the output of the carry bit is zero, the inverter output is one and a one is subtracted from the number of pulses counted from signal conditioner 40. This corrects the number of pulses from the signal conditioner by one if there is no carry and by zero if there is a carry. The resulting corrected number is connected on parallel lines 124 to full cycle clamp 126 in low speed clamp 94.

In the special event that a single count is registered in full cycle register 106 and connected on lines 112 to corrector subtractor 120, and when there is no carry bit on line 100, a zero is stored in corrector subtractor 120. Zero detector 128 senses this condition and generates a clamp signal on its output line 130 which is connected to OR gate 132. The clamp signal at the input of OR gate 132 generates a clamp output signal on line 114 which is connected in parallel to clamp inputs 134 on full cycle clamp 126 and clamp input 136 in fractional cycle clamp 138. The clamp signal at clamp inputs 134 and 136 connects a one to full cycle output lines 116 and a zero to fractional cycle output lines 118 indicating that the source frequency is equal to the sample frequency.

In the special case where no pulse signals from signal conditioner 40 are counted during the sample period, zero detector 142 places a clamp signal on its output line 144 which is connected through OR gate 132 to place clamp signals on the full cycle clamp 126 and fractional cycle clamp 138 as previously described.

When no pulse signals from signal conditioner 40 are detected during a sample period, no useful information can be passed forward for estimation of the front fraction in the following cycle. Consequently, a clear signal is transmitted on line 146 to front fraction cycle estimator 36, see FIG. 2, to clear any values stored in this device.

Full cycle clamp 126 and fractional cycle clamp 138 may be any devices well knwon in the art such as mechanical relays or electronic gates but are preferably integrated circuit switches.

A counter 48 having a capacity equal to twice the sampling period avoids errors in the measurement of infrequent input signals.

Assume, for example, that the maximum count of counter 48 is equal to the number of system clock cycles in the sampling periods and is, for example $512_{10}$. Assume that two sampling periods occur. The count at the last event of the first sampling period is, for example, $400_{10}$. The count of the only event or the second sampling period is some number greater than $400_{10}$, for example, $401_{10}$. Thus, previous full cycle length subtractor 82 calculates the period of the last full cycle as $401_{10} - 400_{10}$ or $1_{10}$ clock pulse. End fraction divider 76 then attempts to divide $1_{10}$ by $111_{10}$ which is an incorrect value for the end fraction. If the count of counter 48 is at least two sampling periods long, this type of error is avoided. To illustrate, suppose that counter 48 has a maximum count equivalent to two sampling periods and that a sampling period devoid of input pulses occurs between the last two input pulses. Again, it is possible that previous full cycle length subtractor 82 calculates a last full cycle period of only $1_{10}$ count. Now, because during the empty sampling period zero detector 142 cleared front fractional cycle estimator 36, the residue in front fractional cycle estimator 36 is zero. So even if end fraction divider 76 outputs its maximum value of 1.0, full cycle register 106 and fraction adder 32 cannot have an output of more than 1.0. Since the last full input period was greater than a sampling period, this clamped value is correct.

It is advantageous to have partial cycle length subtractor 64 and previous full cycle length subtractor 82 work by two's complement addition and to have their output bit length equal to the bit length of the counter 48. This avoids errors that may result from the counter 48 resetting to zero after its maximum count. For example, assume counter 48 is a 10-bit counter. Its maximum count, base 10, is $2^{10}-1$, or $1023_{10}$. Suppose the last event of previous sample period occurred at count $1000_{10}$. This value is stored in previous event register 44. Counter 48 has reset to $0000_{10}$ at the end of the sample period and the only event of the next sample period is a count $50_{10}$, for example. This value is stored in present event register 42. At the end of the sample period, previous full cycle length subtractor 82 tries to subtract the contents of previous event register 44 from the contents of present event register 42, $50_{10}-1000_{10}$, which gives $-950_{10}$. A negative number of counts is an impossible answer and is far from the correct answer of $74_{10}$ counts between the two events.

An N-bit, two's complement subtractor takes the two's complement of an N-bit number at one of its inputs and adds the result to the N-bit number at its second input and discards the carry bit. The resulting N-bit number is the difference between the two input numbers.

As an example of two's complement subtraction, partial cycle length subtractor 64 takes the two's complement of the 10-bit number from counter 48 at its second set of inputs 66 and adds the result to the 10-bit number at its inputs 62 discarding the carry bit to yield a 10-bit number equal to the difference between the two numbers. The number at inputs 66 is taken as ($2^N$-input 66) and added to the number at inputs 62. Since only the last 10 bits are output from partial cycle length subtractor 64, this operation has the effect of subtracting $2^N-2^{10}$ from the remainder. This gives the formal output value from partial cycle length subtractor 64 of $2^N$−input 66+ input 62 $-(2^N-2^{10})=2^{10}-$input 66+ input 62. Substituting the example values of $1000_{10}$ for input 66 and $50_{10}$ for input 62, the final answer is $1024_{10}-1000_{10}=50_{10}=74_{10}$ which is correct.

Figure 4:
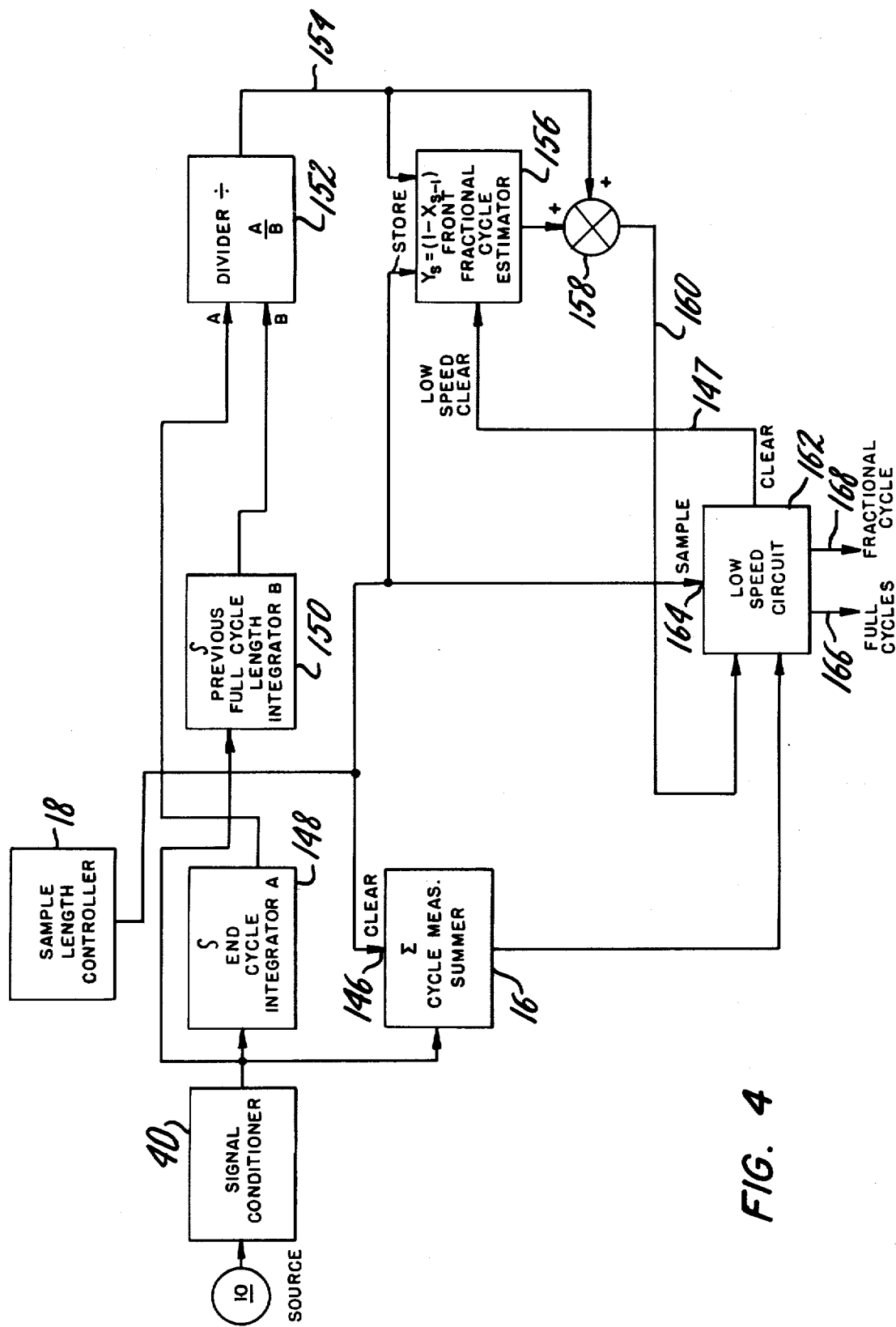
FIG. 4 shows an analog embodiment of the present invention.

Although the preferred embodiment utilizes digital processing, the higher speed of analog computation may make this method desirable in some applications. FIG. 4 shows such an embodiment of the invention employing analog circuits.

As in preceding embodiments, the signal conditioner 40 produces a sequence of repetitive output signals under control of the source 10. For example, the signal conditioner 40 may produce a narrow pulse or other standarized signal one or more times for each cycle of the signal from the source 10. The signal from the signal conditioner 40 is connected to cycle measurement summer 16. Cycle measurement summer 16 is preferably a capacitive storage device to which an increment of charge is added each time signal conditioner 40 generates an output signal. Consequently, the voltage in the cycle measurement summer 16 increases approximately linearly with the number of cycles of the source 10. A clear signal connected from sample length controller 18 to the clear input 146 at the end of each sample period clears the stored data from cycle measurement summer 16 in preparation for the next sample period.

End cycle integrator 148 begins integrating a voltage upon receiving the signal from the signal conditioner 40. End cycle integrator 148 continues to integrate the voltage until the next signal from the signal conditioner which clears the end cycle integrator 148 and allows it to begin integrating for the new cycle. At the end of a sample period, the voltage stored in end cycle integrator 148 is approximately linearly proportional to the length of time from the last output of signal conditioner 40 until the end of the sample period.

The signal from the signal conditioner 40 is also connected to one input of previous full cycle length integrator 150. Previous full cycle length integrator 150 stores a voltage which was integrated over the previous full cycle at approximately the same integration rate as end cycle integrator 148. Previous full cycle integrator 150, therefore, always contains a voltage proportional to the length of the previous full cycle of the source 10.

Other means are available for providing a voltage proportional to the previous full cycle. For example, end cycle integrator 148 and previous full cycle integrator 150 may switch functions on each cycle. That is, at the end of a first cycle, previous full cycle integrator 150 may remain charged for the next cycle of the source while end cycle integrator 148 is cleared and allowed to charge up through the cycle. At the beginning of the next cycle, previous full cycle length integrator 150 may be discharged and allowed to integrate during the second cycle while end cycle integrator 148 is permitted to store the charge from the preceding cycle. Thus the functions of end cycle integrator 148 and previous full cycle integrator 150 reverse upon each output signal from the signal conditioner 40. control and switching methods for accomplishing these functions are well known in the art and these illustrative methods are not exhaustive of the methods which may be employed to integrate and store the last full cycle and integrate the partial length of the present cycle.

The signals from end cycle integrator 148 and previous full cycle length integrator 150 are connected to analog divider 152. Analog divider 152 generates an output signal on output line 154 that is scaled to be a fraction proportional to the ratio of length of the end cycle to the length of the previous full cycle. Analog divider 152 may be any divider circuit well known in the art of analog circuits such as an operational amplifier.

The fractional length on output line 154 is connected to one input of front fractional cycle estimator 156 where it is subtracted from 1 at the end of a sample period and stored as an estimate of the length of the fractional cycle at the beginning of the next sample period. The front fraction estimate calculated as described in the preceding, stored from the previous sample period, is connected to one input of adder 158. The end cycle fraction on output line 154 is connected to a second input of adder 158. The resulting calculated total fractional cycle is connected from an adder 158 on line 160 to one input of low speed circuit 162. The output of cycle measurement summer 16 is also connected to low speed circuit 162.

In the analog computation circuits herein described the computed signals are continuously available to low speed circuit 162. When a sample pulse from sample length controller 18 is connected to the sample input 164 of low speed circuit 162, the values standing at its input may be connected to output lines 166 and 168 to provide an indication of the number of full cycles and fractional cycles respectively in the sample period. Alternatively, the number of full cycles and fractional cycles may be added together in low speed circuit 162 and a single analog output may be generated. Also, the analog voltages thus derived, may be converted to digital signals by analog-to-digital conversion techniques well known in the art. Further, the signal at sample input 164 may enable the storage in low speed circuit 162 of the signals at its other two inputs. This storage may optionally be in capacitive storage elements such as capacitors or the signal may be converted to a digital signal and stored in a register.

As in the preceding embodiments, the low speed circuit 162 provides a clear signal on clear line 147 to cancel the signal stored in front fractional cycle estimator 156 when cycle measurement summer 16 detects zero signals from signal conditioner 40 during the sample period.

It will be understood that the claims are intended to cover all changes and modifications of the preferred embodiments to the invention, herein chosen for the purpose of illustration which do not constitute departures from the spirit and scope of the invention.

What is claimed is:

1. A method for measuring the frequency of an alternating signal during a fixed sample period comprising the steps of:
    (a) measuring the number of full cycles of said alternating signal in said fixed sample period;
    (b) calculating the end fraction less than one of a full cycle between the end of the last full cycle in a sample period and the end of said sample period comprising the steps of:
        (i) generating clock pulses;
        (ii) measuring the number of clock pulses during the last full cycle within a sample period;
        (iii) measuring the number of clock pulses occurring between the end of the last full cycle in the sample period and the end of the sample period; and
        (iv) dividing the number of clock pulses of (iii) by those of (ii) to obtain an end fraction of a cycle;
    (c) subtracting said end fraction from one and storing the result as an estimate of the front fraction in the next sample period; and
    (d) adding the end fraction to the front fraction estimate stored from the preceding period.

2. A frequency measurement device for measuring the frequency of an alternating signal from a source comprising:
    (a) sample length control means for controlling the length of a sample period;
    (b) cycle measurement means for measuring the number of full cycles of said alternating signal during a sample period;
    (c) means for generating clock pulses;
    (e) means for measuring the end fraction of a cycle of said alternating signal between the end of the last full cycle and the end of said sample period comprising:
        (i) last full cycle means for measuring the number of clock pulses during the last full cycle within a sample period;
        (ii) end fractional cycle means for measuring the number of clock pulses occurring between the end of the last full cycle in the sample period and the end of the sample period;
        (iii) end fraction divider means for dividing the number in said end fractional cycle measurement means by the number in said last full cycle measurement means;
    (e) means for estimating the front fraction of a cycle of said alternating signal between the beginning of said sample period and the beginning of the first full cycle of said alternating signal in said sample period;
    (f) said end fraction divider means having limited means for limiting the maximum value of its output to one; and
    (g) said means for estimating the front fraction including (i) means for subtracting the output of said end fraction divider from one; and (ii) means for storing the result as an estimate of the front fraction of the next sample period.

3. The frequency measurement device recited in claim 2 further comprising low speed circuit means for clamping the output of said frequency measurement device to a predetermined value when less than one full cycle of said alternating signal occurs within a sample period.

4. The frequency measurement device recited in claim 3 wherein said predetermined value is equal to said sample period.

5. The frequency measurement device recited in claim 2 further comprising means for adding the output of said end fraction divider and the stored estimate of the front fraction.

6. The frequency measurement device recited in claim 2 wherein said frequency measurement is performed at least partly by digital computation.

7. The frequency measurement device recited in claim 2 wherein said frequency measurement is performed at least partly by analog computation.

8. A frequency measurement device for measuring the frequency of an alternating signal from a source comprising:
    (a) sample length control means for controlling the length of a sample period;
    (b) cycle measurement means for measuring the number of full cycles of said alternating signal during a sample period;
    (c) means for measuring the end fraction of a cycle of said alternating signal between the end of the last full cycle and the end of said sample period;
    (d) means for estimating the front fraction of a cycle of said alternating signal between the beginning of said sample period and the beginning of the first full cycle of said alternating signal in said sample period.
    (e) said sample length control means comprises:
        (i) a clock;
        (ii) a counter driven by said clock and storing therein a number related to received clock pulses; and
        (iii) a sample control generator means connected to said counter for generating sample pulses each time the number stored in said counter equals a predetermined value, said sample pulses defining the beginning and ending of sample periods.
    (f) present event register means for storing the number in said counter which existed at end of the immediately preceding full cycle of said alternating signal;
    (g) previous event register means for storing the number in said counter which existed at the beginning of the immediately preceding full cycle of said alternating signal;

(h) partial cycle length subtractor means effective at the end of a sample period for subtracting the number stored in said present event register means from the number then existing in said counter;

(i) previous full cycle length subtractor means effective at the end of a sample period for subtracting the number stored in said previous event register means from the number stored in said present event register means; and (j) end fraction divider means for dividing the number from said partial cycle length subtractor by the number from said previous full cycle length subtractor, the result of the division being said end fraction.

9. The frequency measurement device recited in claim 8 further comprising limiting means in said end fraction divider means for limiting said end fraction to a maximum of one.

10. The frequency measurement device recited in claim 9 wherein said means for estimating the front fraction of a cycle comprises:
(a) means for subtracting the output of said end fraction divider from one; and
(b) means for storing the result as an estimate of the front fraction of the next sample period.

11. The frequency measurement device recited in claim 10 further comprising means for adding the output of said end fraction divider and the stored estimate of the front fraction whereby a total fractional cycle is calculated.

12. The frequency measurement device recited in claim 11 further comprising low speed circuit means comprising:
(a) means for detecting that less than a predetermined number of cycles of said alternating signal has occurred during a sample period and for generating a clamp signal;
(b) low speed clamp means for connecting the measured full cycles and fractional cycles to output lines; and
(c) said low speed clamp means being operative in the presence of said clamp signal to clamp the signal on said output lines to a fixed predetermined value.

13. The frequency measurement device recited in claim 12 wherein said predetermined number of cycles is two.

14. The frequency measurement device recited in claim 13 further comprising:
(a) detecting means in said low speed circuit means for detecting that neither a beginning nor an ending of a cycle of said alternating signal has occurred;
(b) clamp signal generating means in said low speed circuit means for generating said clamp signal in response to a signal from said detecting means; and
(c) said clamp signal being operative to clear any value stored in said means for estimating the front fraction.

15. The frequency measurement device recited in claim 13 further comprising:
(a) first detecting means for detecting that an alternation marking the beginning of signal cycle occurred in a sample period and the absence of an alternation marking the end of said cycle;
(b) second detecting means for detecting that said total fractional cycle is less than one; and
(c) zero detection means responsive to said first detecting means and said second detecting means for generating said clamp signal.

16. The frequency measurement device recited in claim 15 further comprising:
(a) third detecting means in said low speed circuit means for detecting that neither a beginning nor an ending of a cycle of said alternating signal has occurred;
(b) second clamp signal generating means in said low speed circuit means for generating said clamp signal in response to a signal from said third detecting means; and
(c) said clamp signal from said second clamp signal generating means being operative to clear any value stored in said means for estimating the front fraction.

17. A frequency measurement device for measuring the frequency of an alternating signal from a source comprising:
(a) a sample length control means for controlling the length of a sample period comprising:
 (i) a clock;
 (ii) a counter driven by said clock and storing therein a number related to received clock pulses; and
 (iii) sample control generator means connected to said counter for generating sample pulses each time the number stored in said counter equals a predetermined value, said sample pulses defining the beginning and end of sample periods;
(b) cycle measurement means for measuring the number of full cycles of said alternating signal during a sample period;
(c) means for measuring the end fraction of a cycle of said alternating signal between the end of the last full cycle and the end of said sample period comprising:
 (i) last full cycle measurement means for measuring the number of clock pulses during the last full cycle within a sample period;
 (ii) end fractional cycle measurement means for measuring the number of clock pulses occurring between the end of the last full cycle in the sample period and the end of the sample period;
 (iii) end fraction divider means for dividing the number in said end fractional cycle measurement means by the number in said last full cycle measurement means; and
 (iv) said end fraction divider means having limiting means for limiting the maximum value of its output to one;
(d) means for estimating the front fraction of a cycle of said alternating signal between the beginning of said sample period and the beginning of the first full cycle of said alternating signal in said sample period comprising:
 (i) means for subtracting the output of said end fraction divider from one; and
 (ii) means for storing the result as an estimate of the front fraction of the next sample period; and
(e) means for adding the output of said end fraction divider and the stored estimate of the front fraction.

18. A frequency measurement device for measuring the frequency of an alternating signal from a source comprising:
(a) cycle measurement summer means for summing a signal proportion to the number of cycles of alternation of said alternating signal;

(b) sample length controller means for generating signals defining sample periods;

(c) end cycle integrator means for integrating a signal proportional to the time since the occurrence of the immediately previous alternation of said alternating signal;

(d) previous full cycle length integrator means for integrating a signal proportional to the length of the immediately preceding full cycle of said alternating signal;

(e) the proportions in said end cycle integrator means and said previous full cycle length integrator means being substantially equal;

(f) divider means for dividing the signal in said end cycle integrator means by the signal in said previous full cycle integrator means;

(g) front fractional cycle estimator means for subtracting the signal from said divider means from one at the end of a sample period and storing the result as an estimate of the front fractional cycle in the next succeeding sample period; and (h) adder means operative at the ends of a sample period for adding the output of said divider means to the estimate of the front fractional cycle stored from the immediately preceding sample period.

* * * * *